United States Patent [19]
Deustcher et al.

[11] Patent Number: 6,103,576
[45] Date of Patent: Aug. 15, 2000

[54] DIELECTRIC LAYER OF A MEMORY CELL HAVING A STACKED OXIDE SIDEWALL AND METHOD OF FABRICATING SAME

[75] Inventors: Neil Deustcher, Tempe; Jack Wong, Phoenix, both of Ariz.

[73] Assignee: Microchip Technology Incorporated, Chandler, Ariz.

[21] Appl. No.: 09/290,271

[22] Filed: Apr. 13, 1999

[51] Int. Cl.⁷ ................................................ H01L 21/8247
[52] U.S. Cl. .......................... 438/261; 438/265; 438/258
[58] Field of Search .................................... 438/261, 265, 438/258

[56] References Cited

U.S. PATENT DOCUMENTS

| | | |
|---|---|---|
| 5,063,172 | 11/1991 | Manley . |
| 5,104,819 | 4/1992 | Freiberger et al. . |
| 5,158,092 | 10/1992 | Hanada . |
| 5,420,060 | 5/1995 | Gill et al. . |
| 5,790,455 | 8/1998 | Caywood .............................. 365/185.06 |
| 5,836,772 | 11/1998 | Chang et al. .............................. 438/265 |
| 5,856,221 | 1/1999 | Clementi et al. ......................... 438/258 |
| 5,985,719 | 11/1999 | Keller et al. .............................. 438/265 |

*Primary Examiner*—Richard Booth
*Attorney, Agent, or Firm*—Frohwitter; Paul R. Morico

[57] ABSTRACT

A merged two-transistor memory cell of an EEPROM, and method of fabricating the cell, are provided. The memory cell includes a substrate and gate oxide layer formed on the substrate. It also includes a memory transistor having a floating gate and a control gate, and a select transistor having a gate that is shared with the memory transistor. The memory cell is configured so that the shared gate serves both as the control gate of the memory transistor and the wordline of the select transistor. The memory cell further includes a dielectric layer that is disposed between the floating gate and the shared gate. The dielectric layer is defined by an ONO film and a stacked oxide layer. In fabricating the memory cell, the ONO stack film is formed adjacent to the top surface of the floating gate and the stacked oxide layer is formed adjacent to the side surface of the floating gate.

11 Claims, 7 Drawing Sheets

DIELECTRIC LAYER OF A MEMORY CELL HAVING A STACKED OXIDE SIDEWALL AND METHOD OF FABRICATING SAME

FIELD OF THE INVENTION

The present invention relates generally to memory cells of semiconductor devices, and more particularly to a merged two transistor memory cell having a dielectric layer, which includes an ONO stack film and a stacked oxide sidewall, that is disposed between a floating gate of the memory transistor and the gate shared between the memory transistor and select transistor and a method of fabricating same.

BACKGROUND OF THE INVENTION

EEPROM (Electrically Erasable Programmable Read Only Memory) cells are a class of nonvolatile semiconductor memory in which information may be electrically programmed into and erased from each memory element or cell. Floating gate EEPROM cells are one type of EEPROM cell in which information is stored by placing electronic charge on a "floating gate", typically a region of conductive polysilicon that is electrically isolated from other conducting regions of the device by insulating dielectric layers that surround it. The charge on the floating gate can be detected in reading the memory cell because it changes the threshold voltage of the memory transistor. This change in threshold voltage changes the amount of current that flows through the cell when voltages are applied to it during the read operation and the current can be detected by a sense amplifier circuit.

As stated above, EEPROM cells are nonvolatile, which means that they must retain their information (charge state) even when the power supplied to them is turned off. Thus, it is critically important that the charge stored on the floating gate not "leak" off over time. A product containing EEPROM cells usually has a retention specification in its data sheets which states how long the EEPROM memory cells will retain the information programmed into them without error when the power supplied to them is turned off. Retention specifications typically range between 1 and 20 years. Thus, the dielectric isolation surrounding the floating gate must have very good integrity and this integrity must exist with respect to all of the cells in the memory device. Prior art solutions to this problem proved inadequate as the demand for smaller cell size increased.

In one prior art solution, the control gate is isolated from the floating gate by growing a poly-oxide layer, e.g., a silicon dioxide ($SiO_2$) layer, on the polysilicon floating gate. The control gate polysilicon layer is then deposited on top of the poly-oxide layer. Silicon dioxide grown on heavily doped polysilicon, however, is not a good quality dielectric, and thus for good charge retention, the polysilicon oxide must be relatively thick (<500A) for a viable manufacturing process. To scale the cell area down, while maintaining the same coupling ratio, and thus the same programming voltages, the oxide between the floating gate and control gate must be thinned down, which in turn jeopardizes the integrity of the charge retention, and thus makes this solution less than desirable for smaller cell size devices.

Later solutions were developed in which a 3-layer stack of dielectrics (ONO), consisting of a bottom layer of silicon dioxide, a middle layer of silicon nitride ($Si_3N_4$), and top layer of silicon dioxide, was used as the dielectric isolation between the floating and control gates. In one later solution, the oxide layers in the ONO stack are either thermally grown on the polysilicon floating gate and silicon nitride layer or deposited films. In this solution, the poly 1 layer forming the floating gate and the ONO stack are etched together, so that the ONO stack is self aligned with the floating gate. After this step, a thermal poly-oxide is formed on the sidewall of the floating gate. A drawback of this solution is that the poly-oxide formed on the sidewall of the floating gate was either too thin to prevent the leakage of charge or too thick to make scalability practical. In another later solution, the poly 1 layer forming the floating gate is etched before the ONO film is formed on the floating gate. The drawback of this solution is that the ONO film forms in the gate area of the select transistor. The reason that it is not desirable to have the ONO film in the gate area of the select transistor is that the silicon nitride layer has a tendency to trap electrons and this causes the threshold voltage of the select transistor to drift with the electrical stress to which it is subject during the program and erase operations. This threshold voltage instability is very damaging to the overall cell reliability.

Both of these later solutions employing an ONO stack film, however, proved to be superior to a purely thermally grown polysilicon oxide or a deposited and annealed oxide alone, with respect to both scalability and charge retention. Another advantage of an all-deposited ONO stack is that the pin hole defect density of the stack is greatly reduced since the probability of pin holes overlapping in all three layers is extremely small. Currently, ONO stacks with effective oxide thickness as low as 200A are used.

The idea of employing an ONO stack to isolate the floating and control gates in a modern EEPROM process has also been applied to a type of floating gate EEPROM cell design known as a "split-gate" cell. In traditional two-transistor byte selectable EEPROM cells, a select transistor 1 is in series with each memory cell transistor 2, which includes a poly 1 floating gate 3, as shown in FIGS. 1 and 2. In this configuration, the select transistor 1 is used to isolate the memory transistor 2 during the read and erase operations, and each transistor has its own poly 2 gate 4. The two-transistor configuration takes up considerable area, however. To reduce the die area consumed, it is possible in some cells to merge the select and memory transistors so that they share the same polysilicon gate 30, as shown in FIGS. 3 and 4. (It should be noted that the same reference numerals used in identifying specific elements in FIGS. 7 and 8 discussed in the detailed description below are used in reference to identical elements referred to in prior art FIGS. 3–6). This same configuration is used to increase the programming efficiency of channel hot carrier programmed EEPROM cells and are known as sourceside injection (SSI) cells.

In p-channel EEPROM cells programmed by Fowler-Nordheim tunneling, the shared polysilicon gate 30' may completely overlap the floating gate 28 on both sides, thus splitting the select transistor channel on either side of the floating gate memory transistor channel, as shown in FIGS. 5 and 6. In either case (FIG. 3 and 4 or FIGS. 5 and 6), it is preferable to have an ONO stack separate the floating gate and control gate polysilicon layers (not shown in FIG. 3–6), while at the same time not having the ONO for the gate dielectric of the merged select transistor. Electron trapping still occurs in the ONO stack between the floating and control gates, but this appears as a transient threshold voltage shift of the memory transistor after program or erase and is small in a properly designed process. The threshold shift in the select gate has a more severe effect because the select gate threshold needs to be large enough that bitline current is shut off in a deselected cell, which is in the conductive state. Current leakage in the many deselected cells, which share a common bitline, can cause an "off" cell being read in the one selected wordline to erroneously appear to be in the "on" state.

While the prior solutions employing the ONO stack films are an improvement over earlier solutions employing a thermally grown silicon dioxide layer, they still have several drawbacks. Accordingly, an improved dielectric isolation between the floating gate and control gate is desired.

SUMMARY OF THE INVENTION

In one aspect of the present invention, a memory cell of a semiconductor device is provided. The memory cell includes a first conductive layer having a top surface and a side surface. In one embodiment, the first conductive layer is floating gate of a memory transistor of the memory cell. The memory cell further includes a second conductive layer, which in one embodiment is a gate that connects the memory transistor of the memory cell to an associated select transistor. The memory cell according to the present invention further includes a dielectric layer disposed between the first conductive layer and the second conductive layer. The dielectric layer is formed of an ONO film, which is disposed adjacent to the top surface of the first conductive layer, and a stacked oxide layer, which is disposed adjacent to the side surface of the first conductive layer.

In another aspect of the present invention, a method of fabricating a memory cell of a semiconductor device is provided. The method includes the steps of forming a thermal gate oxide (insulating) layer on a substrate and depositing a first conductive layer having a top surface and a side surface on the gate oxide. The method further includes the steps of forming a dielectric layer on the first conductive layer and depositing a second conductive layer on the dielectric layer. The step of forming the dielectric layer includes the steps of forming an ONO film adjacent to the top surface of the first conductive layer and forming a stacked oxide layer adjacent to the side surface of the first conductive layer.

BRIEF DESCRIPTION OF THE DRAWINGS

Other objects and advantages of the invention will become apparent upon reading the following detailed description and upon reference to the drawings in which.

Figure 1:
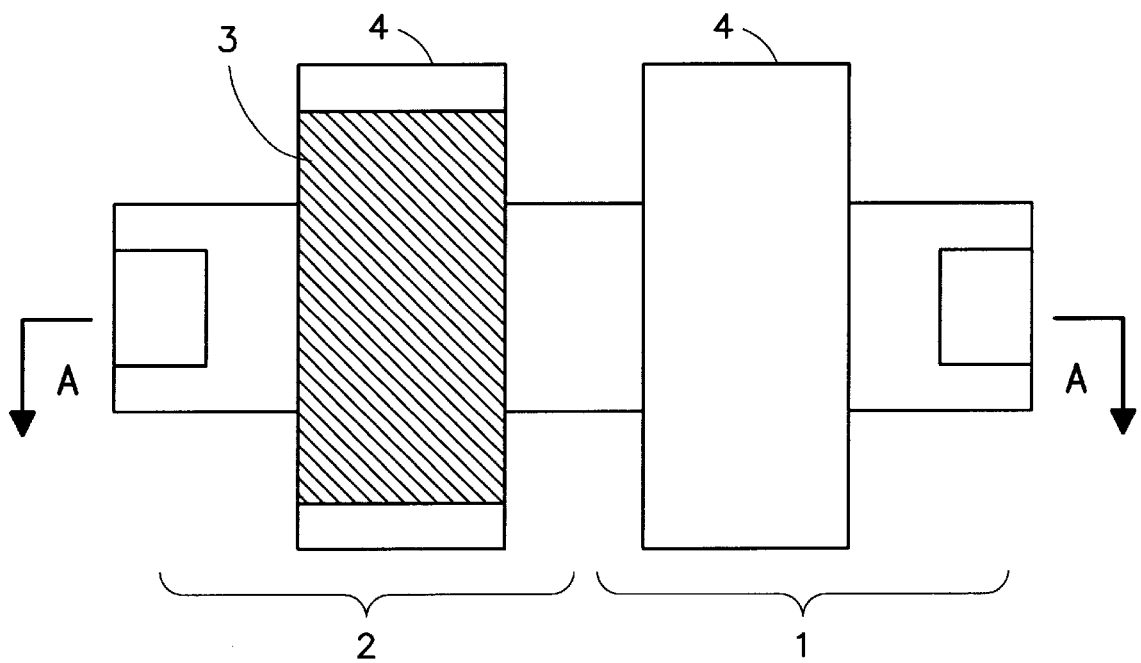
FIG. 1 is a plan view of a prior art p-channel two-transistor cell of an EEPROM.
Figure 2:
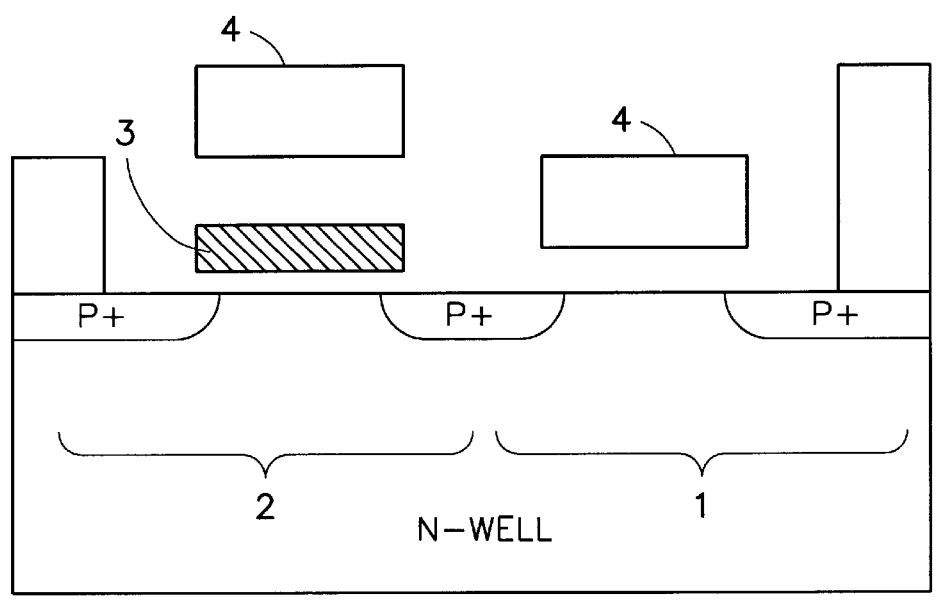
FIG. 2 is a cross-sectional view through line A—A of the prior art p-channel two-transistor cell shown in FIG. 1.
Figure 3:
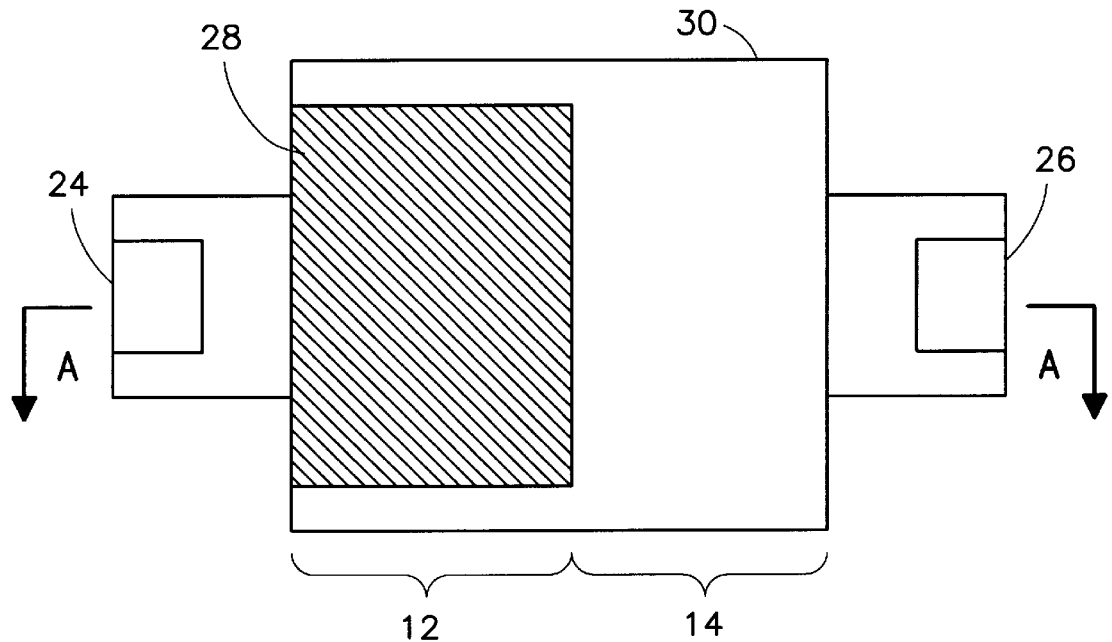
FIG. 3 is a plan view of prior art p-channel split-gate cell of an EEPROM.
Figure 4:
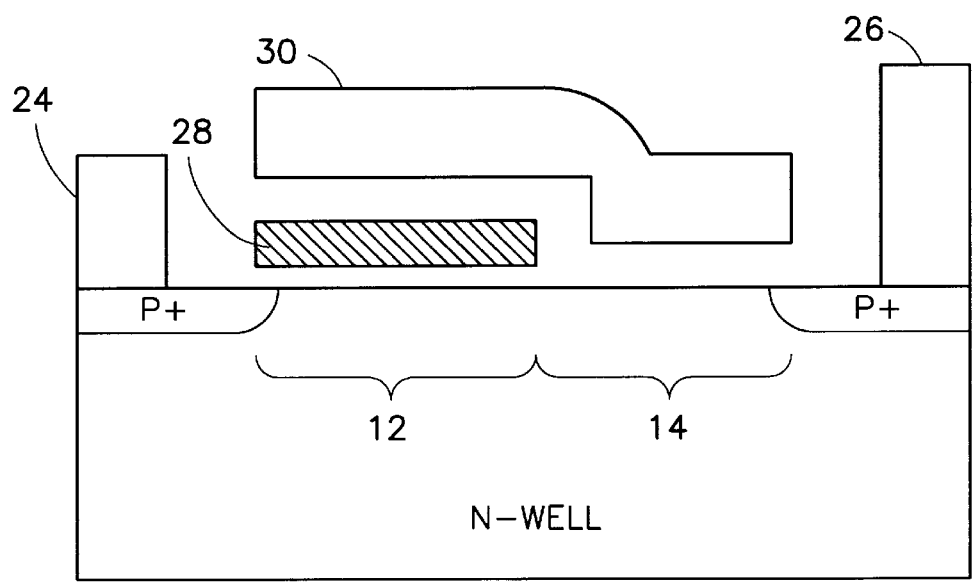
FIG. 4 is a cross-sectional view through line A—A of the prior art p-channel split-gate cell shown in FIG. 3.
Figure 5:
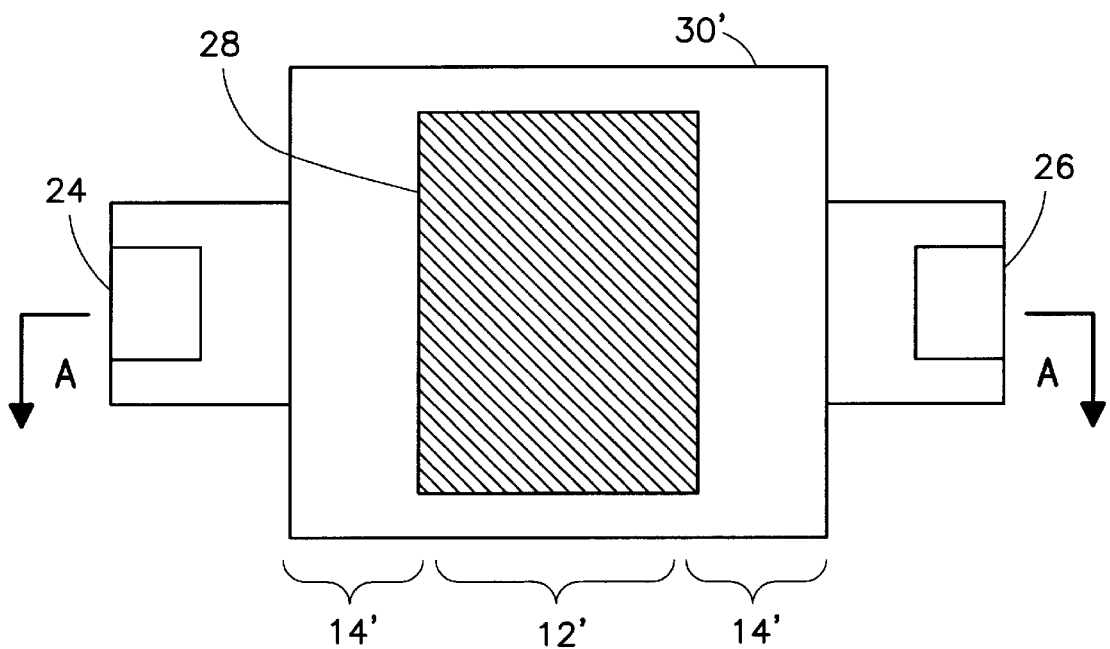
FIG. 5 is a plan view of a prior art p-channel split-gate cell of an EEPROM having a select transistor channel that is split on either side of the memory transistor.
Figure 6:
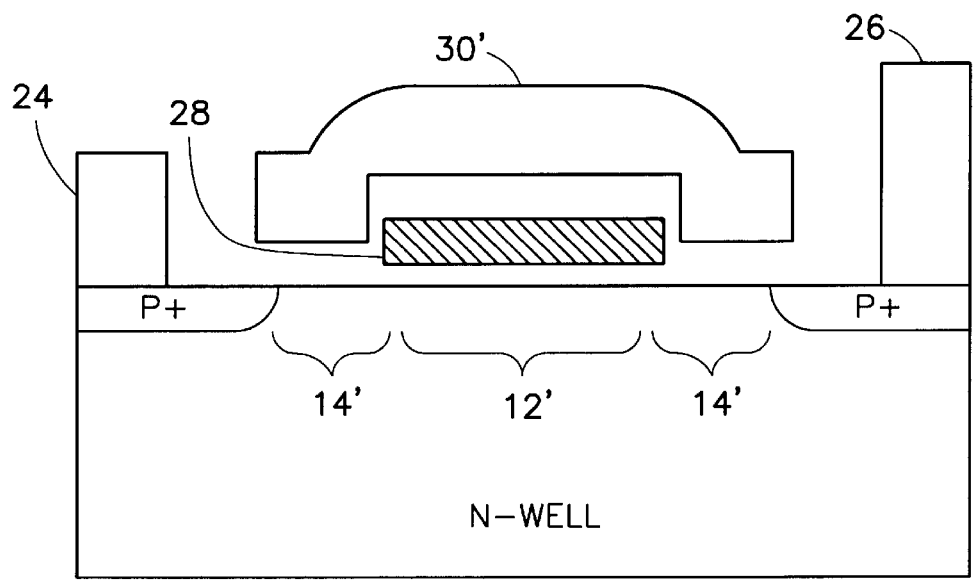
FIG. 6 is a cross-sectional view through line A—A of the prior art p-channel split-gate cell shown in FIG. 5.

While the present invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. For example, although the invention is described relating to merged two transistor memory cells of EEPROMs, such as those shown in FIGS. 7 and 8, it may have application in other memory cell devices.

DETAILED DESCRIPTION OF THE PREFERRED EMBODIMENTS

Turning to the drawings, the preferred embodiments of the present invention will now be described. A p-channel split-gate memory cell of an EEPROM device according to one embodiment of the present invention is illustrated generally by reference numeral 10 in FIG. 7. The memory cell 10 includes a memory transistor 12 and select transistor 14 formed on a silicon substrate 16. The substrate 16 is defined by p-channels 18 and 20 and N-well 22. Reference numeral 24 refers to the metal source contact, which is disposed on p-channel 18, and reference numeral 26 refers to the metal bitline (drain) contact, which is disposed on p-channel 20.

Figure 7:
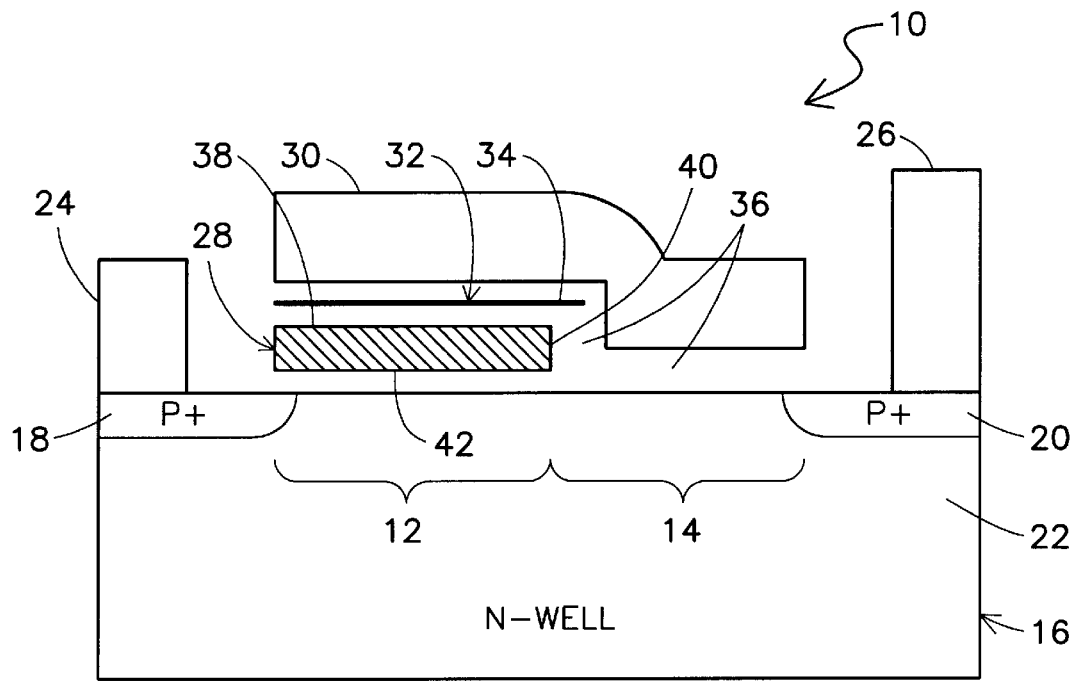
FIG. 7 is a cross-sectional view of a p-channel split-gate cell of an EEPROM according to the present invention.

The memory transistor 12 includes a floating gate 28, which is a conductive layer, a control gate 30, which is a conductive layer and is shared with the select transistor 14, and a dielectric layer 32 disposed between the floating gate 28 and the control or shared gate 30, as shown in FIG. 7. The dielectric layer 32 is defined by an ONO film 34 and a stacked oxide layer 36. The stacked oxide layer 36 has a vertical portion and a horizontal portion. The floating gate 28 has a top surface 38 and a side surface 40.

In accordance with the present invention, the ONO film 34 is disposed between the floating gate 28 and shared gate 30, adjacent to the top surface 38 of the floating gate. The vertical portion of the stacked oxide layer 36 is disposed between the floating gate 28 and the shared gate 30, adjacent to a portion of the side surface 40 of the floating gate 28. The vertical portion of the stacked oxide layer helps to minimize the leakage of charge from the side surface 40 of the floating gate 28 relative to a thermal oxide of the same thickness. The horizontal portion of the stacked oxide layer 36 is disposed between the shared gate 30 and the substrate 16, and serves as the thermal gate oxide for the select transistor. Because this layer does not contain silicon nitride, it does not trap electrons, and thus minimizes threshold voltage drift of the select transistor 14.

The select transistor 14 includes wordline 30, which, as noted above, is also the gate shared with the memory transistor 12. A gate oxide 42 is also provided between the floating gate 28 and the silicon substrate 16.

Figure 8:
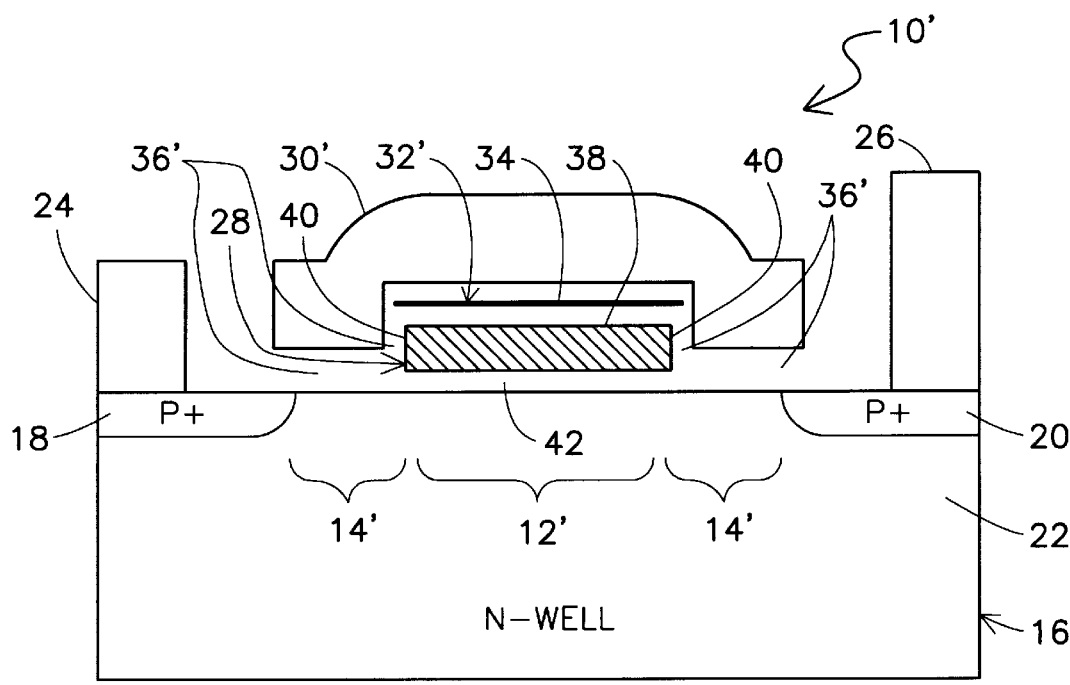
FIG. 8 is a cross-sectional view of a p-channel split-gate cell of an EEPROM having a select transistor channel that is split on either side of the memory transistor according to the present invention.

FIG. 8 illustrates another embodiment of the present invention. In this embodiment, the shared gate, which is illustrated by reference numeral 30', is split on either side of the floating gate 28, i.e., the shared gate 30' surrounds the entire side surface 40 of the floating gate. Also, in this embodiment, the vertical portion of the stacked oxide layer 36' is disposed adjacent to the entire side surface 40 of the floating gate 28. Also, the horizontal portion of the stacked oxide layer 36' is disposed between the shared gate 30' and the substrate 16 on all sides of the floating gate 28. It should be noted that identical reference numerals are used in FIGS. 7 and 8 for identical elements.

Figure 9:
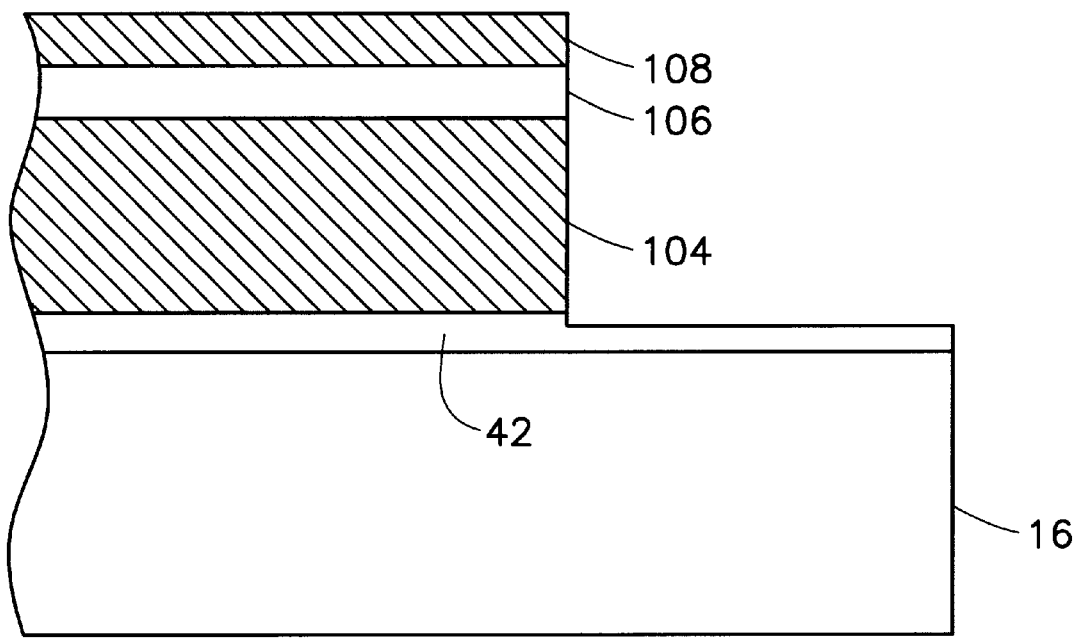
FIG. 9 illustrates the steps involved in forming the N (silicon nitride) and O (silicon dioxide) layers in an ONO film of a dielectric layer according to the present invention.

The method of fabricating the memory cells 10, 10' will now be described with reference to FIGS. 9 through 13. After other steps in the process of manufacturing the memory cells 10, 10' have been performed, such as well formation, device isolation, threshold adjust implants, etc, which do not form a part of the present invention, the gate oxide 42 of the memory transistor 12, 12' is formed. This step is performed by growing a $SiO_2$ layer 42 on substrate 16, which is formed of silicon (Si), as shown in FIG. 9. As those of ordinary skill in the art will appreciate, the layer 42 may also be a tunnel oxide and typically has a thickness in the range of 60–120A.

In the next phase in the process, the floating gate 28 of the memory transistor and ONO film are formed. These steps proceed as follows. First, a polysilicon layer 104, preferably with a thickness in the range of 1000–3000 A (angstroms), is deposited on the gate oxide 42. Next, the polysilicon layer 104 is doped with n- or p- dopants to make it conductive. This may be accomplished by either annealing the layer in a furnace using ($POCl_3$) gas or by doping the polysilicon layer 104 in-situ when deposited, i.e., during the depositing step. As those of ordinary skill in the art will appreciate, other methods may be used to dope the polysilicon layer 104. It should be noted, however, that the particular method and point at which the polysilicon layer is doped is not part of the present invention.

Next, a $SiO_2$ layer 106, preferably with a thickness in the range of 60–120A, is deposited on top of the polysilicon layer 104. The layer 106 is then thermally annealed between 800 and 1000-deg C to densify and improve the insulating quality of the oxide. This layer becomes the bottom oxide of the ONO film disposed on the top surface of the floating gate 28. Next, a silicon nitride ($Si_3N_4$) layer 108, preferably with a thickness in the range of 60–200A, is deposited on the $SiO_2$ layer 106. This layer becomes the silicon nitride layer of the ONO film on the top surface of the floating gate 28.

Next, a protective photoresist layer (not shown) is deposited on the stack of films formed. The photoresist layer is patterned with a mask and used to define the floating gate 28. The stack of films is then anisotropically etched down to the bottom-most $SiO_2$ layer 100 so as to leave at least a portion of the $SiO_2$ layer 42 on the substrate 16, as shown in FIG. 9. The photoresist layer protects the floating gate areas during etching. The photoresist layer is then removed by a plasma process or other process known in the art, thus leaving floating gate 28 etched in the film stack.

Figure 10:
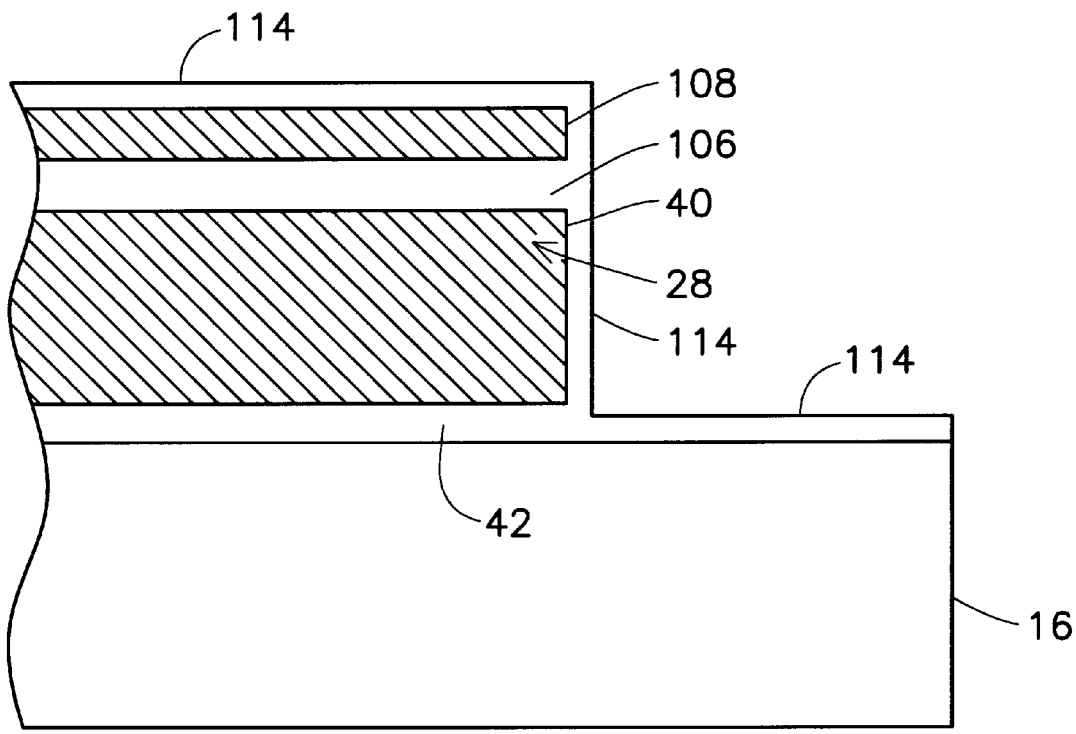
FIGS. 10–12 illustrate the steps involved in forming the second O (silicon dioxide) layer in the ONO film and the stacked oxide layer of the dielectric layer according to the present invention.

In the next step in the process, the wafer is cleaned using a standard wet chemical process, a dry plasma process or other similar process known to those of ordinary skill in the art. A $SiO_2$ layer 114 is then deposited, preferably between 60 and 120 A thick, on the surface of the $Si_3N_4$ layer 108, the side surface 40 of the floating gate 28, and the gate oxide 42, as shown in FIG. 10.

Figure 11:
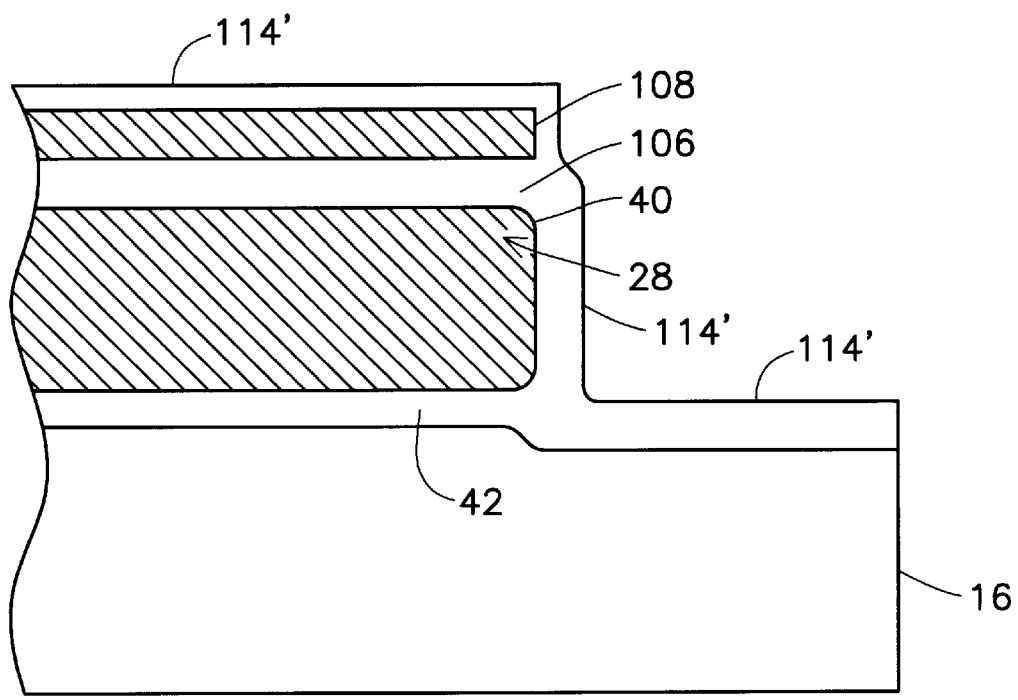
Figure 12:
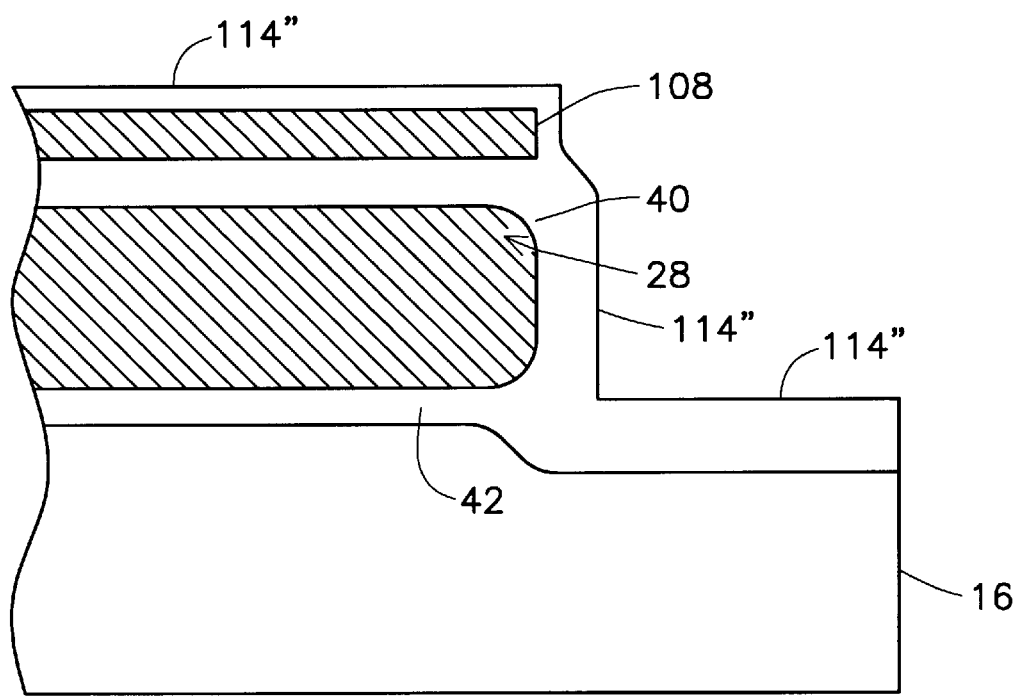

In the next step of the process, a thermal oxidation step is performed on the top $SiO_2$ layer 114. During this step, the $SiO_2$ layer 114 is heated in a steam and/or oxygen rich environment (i.e., an $H_2O/O_2$ gas) between 800 and 950 deg-C for a period of 1–30 minutes, so as to anneal and density the layer. Those of ordinary skill in the art should appreciate that the gas mixture can be comprised of pure steam, pure $O_2$, or any combination thereof. This causes the $SiO_2$ layer 114 to grow into what is referred to as $SiO_2$ layer 114'. The total thickness of the $SiO_2$ layer 114' following the thermal oxidation step is between approximately 60 and 120 A above the $Si_3N_4$ layer 108, between approximately 100 and 500 A on the side surface 40 of the floating gate 28, and between approximately 100 and 300 A above the substrate 16. As shown in FIG. 11, there is some lateral oxidation of the polysilicon in the floating gate 28 that occurs under the $Si_3N_4$ layer 108. However, almost no oxide grows on the sidewalls of the $Si_3N_4$ layer 108 at these temperatures. This is important because it allows the sidewalls of the $Si_3N_4$ layer 108 to seal the edge and corner of the floating gate 28. The $Si_3N_4$ layer 108 acts as an oxidation barrier and prevents further oxidation of the polysilicon material in the floating gate 28 in subsequent fabrication steps.

Next, an oxidation step is performed on the $SiO_2$ layer 114'. During this step, the $SiO_2$ layer 114' is heated in an oxygen-rich environment (i.e., an $O_2$ gas) between 800 and 950-deg C for a period of 1–30 minutes, so as to further anneal and density the layer. This causes the $SiO_2$ layer 114' to grow into what is referred to as $SiO_2$ layer 114". The total thickness of the $SiO_2$ layer 114" following this step is then between approximately 60 and 120 A above the $Si_3N_4$ layer 108, between approximately 100 and 600 A on the side surface 40 of the floating gate 28, and between approximately 100 and 400 A above the substrate 16. The purpose of this second oxidation step is to anneal and densify the $SiO_2$ layer 114" on the side surface 40 of the floating gate 28 and above the substrate 16 to their final target thicknesses before the shared gate electrode 30 is put down. By breaking the anneal/densification into two oxidation steps, the $SiO_2$ layer 114" can be optimized to produce a maximally-thick oxide layer on the side surface 40 of the floating gate 28, while at the same time produce a high-quality gate oxide above the substrate 16.

Figure 13:
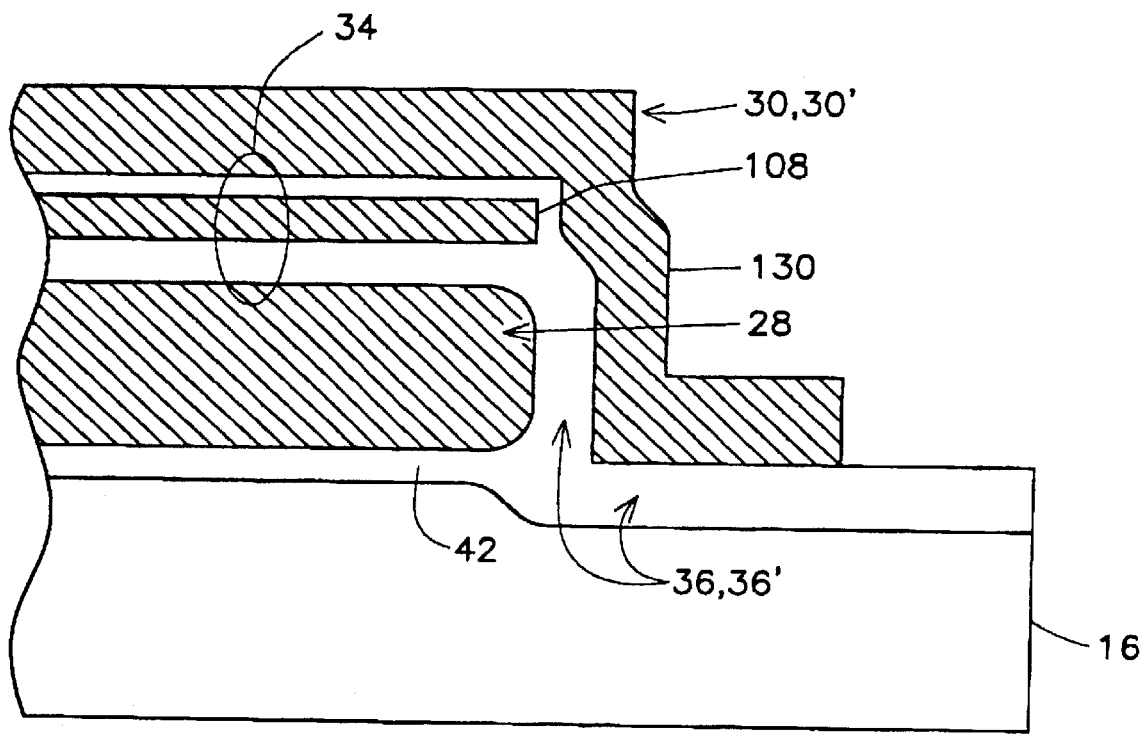
FIG. 13 illustrates the steps involved in forming the shared gate according to the present invention.

In the next phase of the process, the shared gate electrode 30, 30' of the select and memory transistors is formed. In the initial step in this phase, a polysilicon layer 130, preferably with a thickness in the range of 1000–3000A, is deposited on the ONO film 34 and select transistor gate oxide (the horizontal portion of layer 36, 36'), as shown in FIG. 13. Next, the polysilicon layer 130 is doped to make the layer conductive. In this step, preferably n- or p-dopants are incorporated into the polysilicon layer 130. This may be accomplished by either annealing the layer in a furnace using ($POCl_3$) gas or by doping the polysilicon layer 130 in-situ when deposited, i.e., during the depositing step. As those of ordinary skill in the art will appreciate, other methods may be used to dope the polysilicon layer 130. It should be noted, however, that the particular method and point at which the polysilicon layer 130 is doped is not part of the present invention.

Next, a layer of tungsten silicide with a thickness in the range of 1000–3000 A is deposited on top of the polysilicon (not separately shown). The polysilicon layer and the tungsten silicide layer together form the shared gate electrode. Next, an $SiO_2$ layer between 1000–3000 A is deposited on top of the tungsten silicide to cap the silicide during the subsequent fabrication steps. As those of ordinary skill in the art will appreciate, the presence or absence of the tungsten silicide layer and the $SiO_2$ cap is not absolutely necessary for forming the shared gate electrode and is not part of the present invention.

Next, a protective photoresist layer (not shown) is deposited on a portion of the polysilicon layer 130. The protective photoresist layer is patterned with a mask to define the gate electrodes of the transistors of the memory cell. An etch step is then performed, which removes the portion of the polysilicon layer 130 that is not covered by the protective photoresist layer, and which stops within the gate oxide of the select transistor. Next, the protective photoresist layer is removed. The ONO film 34 is left covering the top surface 38 of the floating gate 28, and a stacked oxide layer 36, 36' is left covering the side surface of the 40 of the floating gate 28. The horizontal portion of the stacked oxide layer 36, 36', i.e., the portion remaining outside of the floating gate region, serves as the thermal gate oxide for the select transistor 14.

The remaining steps required to form the remaining components of the memory cell, such as formation of source and drain regions and metal interconnect, can then be done to complete the fabrication process. The details of these steps do not form a part of the present invention.

While the embodiments discussed above involve the fabrication of p-channel cells, those of ordinary skill in the art will appreciate, the present invention is equally applicable to an n-channel cell. It should further be recognized that the present invention is also independent of the method of programming and erasing the memory cell. Furthermore, the present invention is applicable to other split-gate cells in EFPROM devices and other memory cells in general. In addition, those of ordinary skill in the art should appreciate that other process steps (not forming a part of the present invention) are involved in fabrication of a memory cell then those described herein. It should therefore be evident that the particular embodiments disclosed above may be altered or modified and all such variations are considered within the scope and spirit of the invention. Accordingly, the protection sought herein is as set forth in the claims below.

What is claimed is:

1. A method of fabricating a memory cell of a semiconductor device, comprising the steps of:
    (a) depositing a conductive layer having a top surface and a side surface;
    (b) forming an ONO film adjacent to the top surface of the conductive layer; and
    (c) forming a stacked oxide layer adjacent to the side surface of the conductive layer, wherein the step of forming the stacked oxide layer comprises the steps of:
        (i) depositing a $SiO_2$ layer on the side surface of the conductive layer;
        (ii) heating the $SiO_2$ layer in an oxygen-containing gas; and
        (iii) oxidizing the $SiO_2$ layer.

2. The method of fabricating a memory cell according to claim 1, further comprising the step of forming a thermal gate oxide on a substrate, said thermal gate oxide being disposed between the substrate and the conductive layer.

3. The method of fabricating a memory cell according to claim 1, wherein the conductive layer is deposited between approximately 1000 and 3000 angstroms thick.

4. The method of fabricating a memory cell according to claim 1, wherein the step of forming the ONO film, comprises the steps of:
    (a) depositing a first $SiO_2$ layer;
    (b) thermally annealing the first $SiO_2$ layer;
    (c) depositing a first $Si_3N_4$ layer on the first $SiO_2$ layer; and
    (d) depositing a second $SiO_2$ layer on the first $Si_3N_4$ layer.

5. The method of fabricating a memory cell according to claim 4, wherein the first $SiO_2$ layer is deposited between approximately 60 and 120 angstroms thick, the first $Si_3N_4$ layer is deposited between approximately 60 and 200 angstroms thick, and the second $SiO_2$ layer is deposited between approximately 60 and 120 angstroms thick.

6. The method of fabricating a memory cell according to claim 4, wherein the step of forming the ONO film, further comprises the step of heating the second $SiO_2$ layer in a gas selected from the group consisting of $H_2O$, $O_2$, and $H_2O$ and $O_2$, between 800 and 950 deg-C so as to anneal and densify the second $SiO_2$ layer.

7. The method of fabricating a memory cell according to claim 6, wherein the step of forming the ONO film, further comprises the step of oxidizing the second $SiO_2$ layer in an $O_2$ gas between 800 and 950 deg-C so as to anneal and densify the second $SiO_2$ layer to its final desired thickness.

8. The method of fabricating a memory cell according to claim 1, wherein in step (c)(ii) the $SiO_2$ layer is heated between approximately 800 and 950-deg C for approximately 1–30 minutes, and in step (c)(iii) the $SiO_2$ layer is heated between approximately 800 and 950 deg-C for approximately 1–30 minutes.

9. The method of fabricating a memory cell according to claim 1, wherein the oxygen-containing gas in heating step (c)(ii) is selected from the group of gases consisting of $H_2O$, $O_2$, and $H_2O$ and $O_2$.

10. The method of fabricating a memory cell according to claim 1, wherein the $SiO_2$ layer is oxidized in an $O_2$ gas.

11. The method of fabricating a memory cell according to claim 1, further comprising the step of depositing a conductive layer on the ONO film and stacked oxide layers, ONO film and stacked oxide layer being disposed between the two conductive layers and forming a dielectric layer between said conductive layers.

* * * * *